(12) United States Patent
Rösener

(10) Patent No.: US 7,702,716 B2
(45) Date of Patent: Apr. 20, 2010

(54) ANALOGUE MULTIPLIER

(75) Inventor: Detlef Rösener, Berlin (DE)

(73) Assignee: Alcatel, Paris (FR)

( * ) Notice: Subject to any disclaimer, the term of this patent is extended or adjusted under 35 U.S.C. 154(b) by 1044 days.

(21) Appl. No.: 11/401,380

(22) Filed: Apr. 11, 2006

(65) Prior Publication Data

US 2006/0232334 A1    Oct. 19, 2006

(30) Foreign Application Priority Data

Apr. 19, 2005    (EP) .................................. 05300289

(51) Int. Cl.
*G06G 7/16* (2006.01)
(52) U.S. Cl. ...................................... 708/835
(58) Field of Classification Search .................. 708/835
See application file for complete search history.

(56) References Cited

U.S. PATENT DOCUMENTS

| | | | |
|---|---|---|---|
| 3,732,406 | A | 5/1973 | Schlatter |
| 3,780,273 | A | 12/1973 | Turrell |
| 4,118,787 | A | 10/1978 | Arnoux |
| 4,236,117 | A | 11/1980 | Watanabe et al. |
| 4,362,998 | A | 12/1982 | Watanabe et al. |
| 4,833,639 | A | 5/1989 | Keate |
| 4,950,923 | A | 8/1990 | Garuts |
| 5,880,631 | A | 3/1999 | Sahota |
| 6,150,857 | A | 11/2000 | Blaser |
| 6,169,452 | B1 | 1/2001 | Popescu et al. |
| 6,353,348 | B1 | 3/2002 | Blaser |

2004/0227559 A1 *  11/2004  Erba et al. ............... 327/356

FOREIGN PATENT DOCUMENTS

| | | |
|---|---|---|
| DE | 2 304 158 | 8/1974 |
| DE | 26 33 951 A1 | 2/1977 |
| DE | 3875963 | 12/1992 |
| DE | 44 15 859 | 11/1995 |
| EP | 0346435 B1 | 12/1989 |
| EP | 0 474 916 A2 | 3/1992 |
| EP | 0 598 385 A1 | 5/1994 |

(Continued)

OTHER PUBLICATIONS

J P Silver: "RF, RFIC & Microwave Theory Design, Gilbert Cell Mixer Design Tutorial.:" pp. 1-20.

(Continued)

*Primary Examiner*—Tan V Mai
(74) *Attorney, Agent, or Firm*—Carmen Patti Law Group, LLC

(57) ABSTRACT

An analogue multiplier circuit has an input coefficient voltage dependent adjustment of its frequency response. The multiplier contains a multiplier cell (MC) with an RF input (Vin+, Vin−) and a coefficient signal input (Vcoeff+, Vcoeff−), one or more capacitors ($C_p1$, $C_p2$) as peaking capacitors, which one contact connects to the multiplier cell (MC) and the other to a variable resistance ($M_p1$, $M_p2$), i.e. a MOS transistor, and a control circuit (CT) for controlling the variable resistance ($M_p1$, $M_p2$). The control circuit (CT) is connected to the coefficient signal input (Vcoeff+, Vcoeff−) of the multiplier. In the case of a four-quadrant multiplier a rectifier (RT) is connected between the coefficient input (Vcoeff+, Vcoeff−) of the multiplier and the control circuit (CT).

8 Claims, 4 Drawing Sheets

FOREIGN PATENT DOCUMENTS

| | | |
|---|---|---|
| EP | 1 450 480 A1 | 8/2004 |
| GB | 2 316 785 A | 3/1998 |
| JP | 59-216277 | 12/1984 |
| JP | 04-052925 | 2/1992 |
| JP | 05-205082 | 8/1993 |
| JP | 06-236449 | 8/1994 |
| JP | 10-154195 | 6/1998 |
| JP | 2004-110530 | 4/2004 |
| WO | WO 00/21197 A1 | 4/2000 |

OTHER PUBLICATIONS

Osafune, Kazuo et al; 20-GHz 5-dB-Gain Analog Multipliers with AlGaAs/GaAs HBTs; PP4, IEEE MTT-S Digest; 1991; pp. 1285-1288; NTT LSI Laboratories, Atsugi'shi, Kanagawa Pref., Japan.

Suzak, Tetsuyuki et al; Si Bipolar Chip Set for 10-Gb/s Optical Receiver; IEEE Journal of Solid-State Circuits; Dec. 1992; pp. 1781-1786; vol. 27, No. 12; IEEE.

Masuda, T. et al; SA 19.7: 40Gb/s Analog IC Chipset for Optical Receiver Using SiGe HBTs; Central Reserach Laboratory, Hitachi, Ltd; 2 pages; Musashino Office, Hitachi Device Engineering, Co. Ltd, Tokyo, Japan, 1998.

Burr-Brown; Wide Bandwidth Precision Analog Multiplier; MPY634; 1985; :DS-636D; pp. 1-8; Burr-Brown Corporation USA.

Analog Devices; Internally Trimmed Precision IC Multiplier; AD632; pp. 1-6; Rev. A; www.analog.com; Analog Devices, Inc.; 1997; USA.

Analog Devices; 250 MHz, Voltage Output 4-Quadrant Multiplier; AD835; pp. 1-12; Rev. B; www.analog.com; Analog Devices, Inc.; 2003; USA.

Analog Devices; InternallyTrimmed Precision IC Multiplier; AD534; 14 pages; Rev. B; www.analgo.com; Analog Devices, Inc.; 1999; USA.

* cited by examiner

Fig. 1  Prior Art

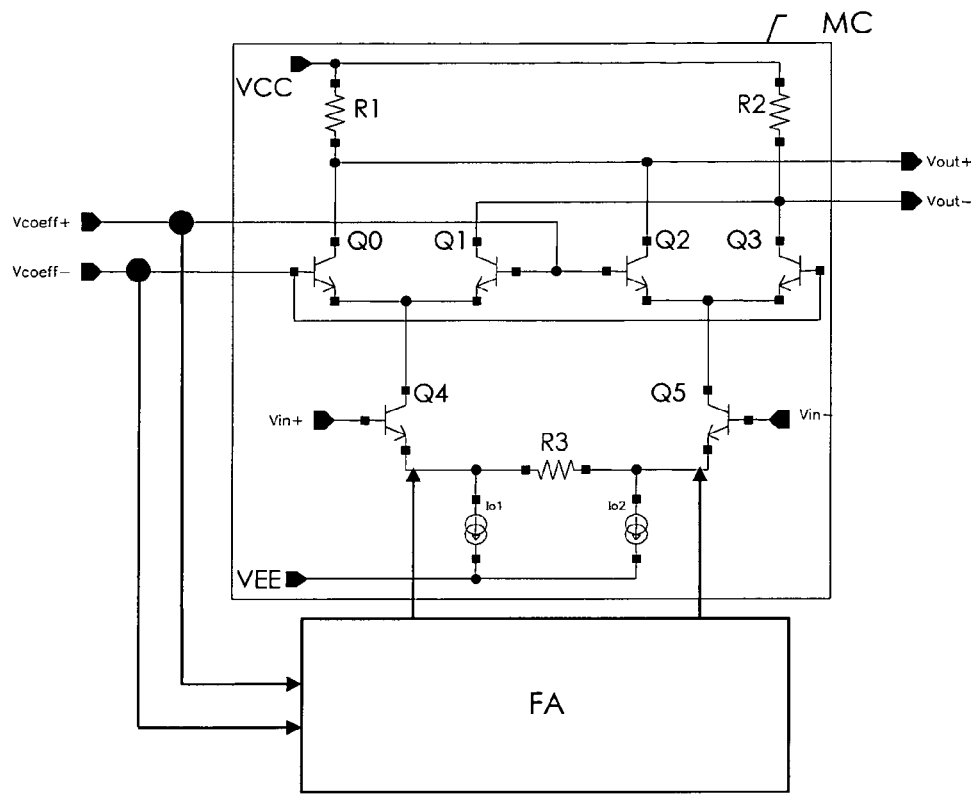
*Fig. 2*
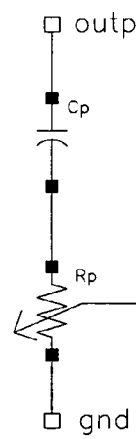
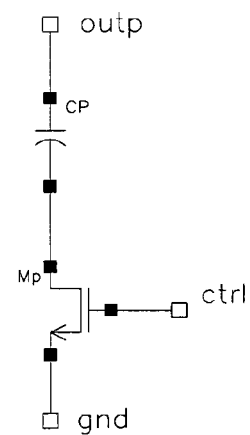
*Fig. 4a*  *Fig. 4b*

ANALOGUE MULTIPLIER

The invention is based on a priority application 05300289.5 which is hereby incorporated by reference.

FIELD OF THE INVENTION

The present invention relates to the field of electronics and more particularly to an analogue multiplier circuit for to weighting an RF-signal with a variable coefficient signal.

BACKGROUND OF THE INVENTION

High-speed analogue multipliers are often used as parts of high-speed linear equalisers (LE) and/or decision feedback equalisers (DFE) to compensate distortions caused by of optical fibres in optical transmission lines. These multipliers function as variable gain amplifier and must be linear over a wide frequency range. The high-speed requirements of optical transmission lines need high-speed electronic components, which circuits must be designed for advanced semiconductor technologies at their speed edges. But it is essential for the function of an LE or DFE, that the high frequency parts of an RF-signal as well as the low frequency parts were multiplied with the same coefficient or weight. On the other hand, the bandwidth of analogue multipliers used for weighting (damping or amplifying) an RF-signal decreases at lower coefficients rapidly or increases at higher coefficients with gain peaks at high frequencies.

The reasons for this behaviour are the parasitic capacitances at the output nodes of the multiplier (see $C_{par}$ in FIG. 1) and the decreasing currents to charge and discharge these at lower coefficient input voltages. Caused by decreasing coefficient input voltage the output voltage decreases because the resultant currents in the load resistors R1 and R2 are decreasing, too (iR1=iQ0−iQ2). This effect is mitigated by the decreasing amplitude of the output voltage but the bandwidth loss is greater.

A well known possibility to increase the bandwidth of analogue multipliers is the use of so called peaking capacitors shown as capacitor C1 in FIG. 1.

Another solution to achieve a higher bandwidth is the compensation of parasitic capacitances with a compensation circuit as known from EP 1450480 A1 entitled "Low-noise, high-linearity analogue multiplier".

However, the values of fixed peaking capacitors or a fixed compensation of parasitic capacitances are independent of the variable coefficients used for weighting the analogue RF-signal. If this fixed solution is used to achieve an acceptable bandwidth for low coefficients, the frequency response at high coefficients has an unacceptable gain peak at high frequencies, which leads to additional phase shifts or, at worst cases, to oscillations. If the gain peak at high coefficients is avoided, the bandwidth at low coefficients decreases rapidly and a high linearity at high frequencies cannot be reached.

It is therefore an object of the present invention to provide an analogue multiplier circuit does not show a decrease of bandwidth at low coefficients and which achieves a higher linearity of the RF-signal at high frequencies.

SUMMARY OF THE INVENTION

These and other objects that appear below are achieved by an analogue multiplier circuit which provides an input coefficient voltage dependent adjustment of its frequency response. The multiplier contains a multiplier cell with an RF input and a coefficient signal input, one or more capacitors as peaking capacitors, which one contact connects to the multiplier cell and the other to a variable resistance, i.e. a MOS transistor, and a control circuit for controlling the variable resistance. The control circuit is connected to the coefficient signal input of the multiplier. In the case of a four-quadrant multiplier, a rectifier is connected between the coefficient input of the multiplier and the control circuit.

The invention provides an improvement of the frequency behaviour of integrated high-speed analogue multipliers to achieve a high linearity at high frequencies over a great coefficient range due to the control of the frequency behaviour by the coefficient input voltage.

With the present invention it is hence possible to achieve the required linear frequency range with semiconductor technologies, which works at their speed edges. The advantage is the use of cheaper technologies or to solve the design task generally for a given transmission bit rate.

Moreover, no additional high current consumption at the multiplier is necessary. The additional control circuit and, if needed, the rectifier require in relation to the multiplier only a negligible current consumption because they operate at DC or very low frequency coefficient changes.

BRIEF DESCRIPTION OF THE DRAWINGS

Preferred embodiments of the present invention will now be described with reference to the accompanying drawings in which

FIG. 2 shows in a schematic circuit diagram the principle of the invention;

FIGS. 4a and 4b show peaking filters for use in the circuit of FIG. 2;

DETAILED DESCRIPTION OF THE INVENTION

Figure 1:
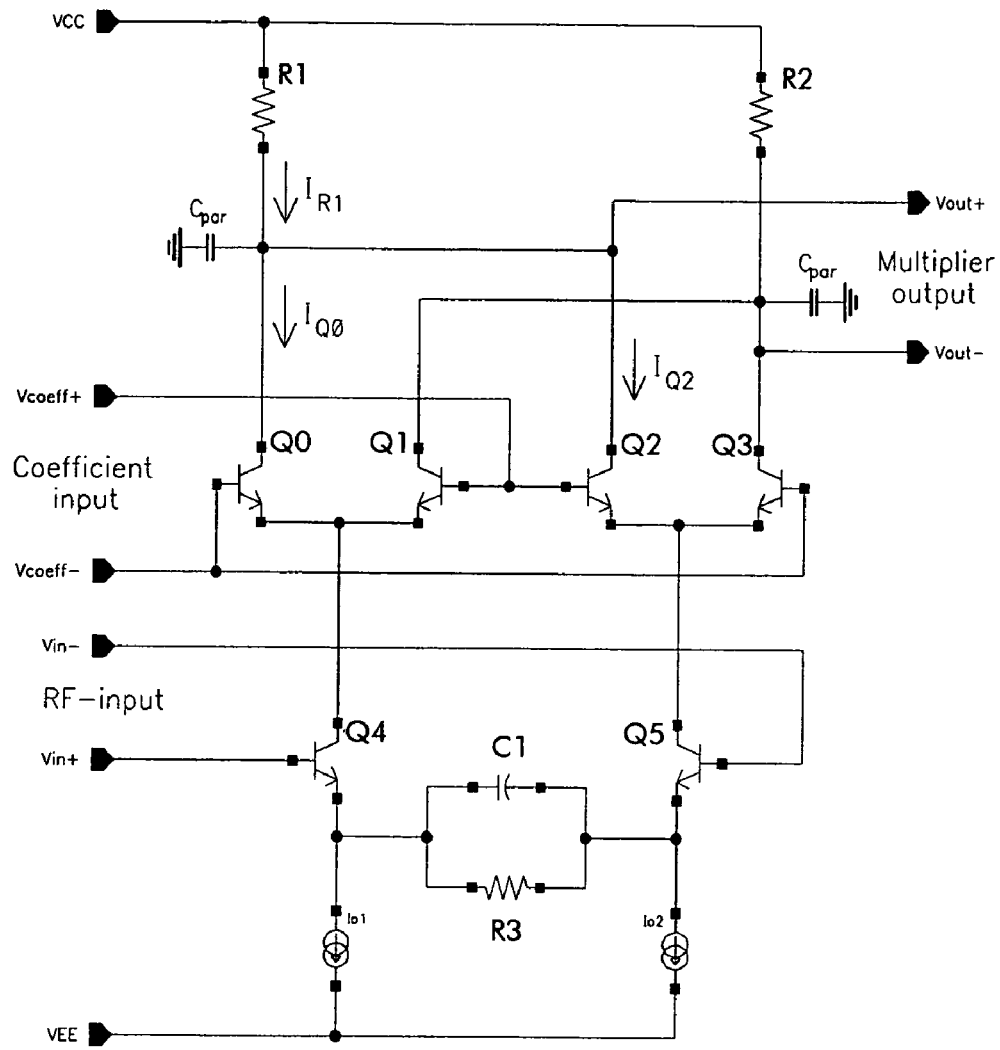
FIG. 1 shows a circuit diagram of a prior art multiplier circuit.

FIG. 1 shows a prior art multiplier which is based on the well known Gilbert cell mixer, which is described for instance in the article "Gilbert Cell Mixer Design Tutorial" by J. P. Silver, retrievable under www.rfic.co.uk. An RF signal Vin+, Vin− is applied to the transistors Q4 and Q5, which perform a voltage to current conversion. Transistors Q0 to Q3 form a multiplication function, multiplying the linear RF signal current from Q4 and Q5 with the coefficient input signal Vcoeff+, Vcoeff− applied across Q0 to Q3, which provide the switching function. Q4 and Q5 provide +/− RF current and Q0 and Q3 switch between them to provide the RF signal or the inverted RF signal to the left hand load, while Q1 and Q2 switch between them for the right hand load. The two load resistors R1, R2 form a current to voltage transformation giving differential output signals Vout+, Vout−. Bias circuits Io1, Io2 serve to set the operating points of the analogue multiplier. A peaking capacitor C1 is connected between transistors Q4 and Q5 to increase the bandwidth of multiplier cell and balance the effect of parasitic capacitances $C_{par}$.

Starting from this basic circuit, a basic idea of the invention is to provide a coefficient dependent peaking filter. This filter can be implemented as a series connection of a fixed capacitor and a variable resistance. To allow simple integration, a MOS transistor is preferably used as variable resistance. A control circuit, which adjusts the resistance of the variable resistance, receives as an input the coefficient signal Vcoeff+, Vcoeff−. This is shown schematically in FIG. 2, where the basic multiplier cell MC, which is implemented as a Gilbert Cell of the type described above, is connected to a frequency response adjustment circuit FA, that receives as an input the coefficient input signal Vcoeff+, Vcoeff−. The frequency response adjustment circuit FA serves to dynamically adjust the frequency response of the analogue multiplier in dependence of the actual coefficient signal value. With this simple measure, an increase of bandwidth at low coefficients and a higher linearity of the RF-signal at high frequencies can be achieved.

Figure 3:
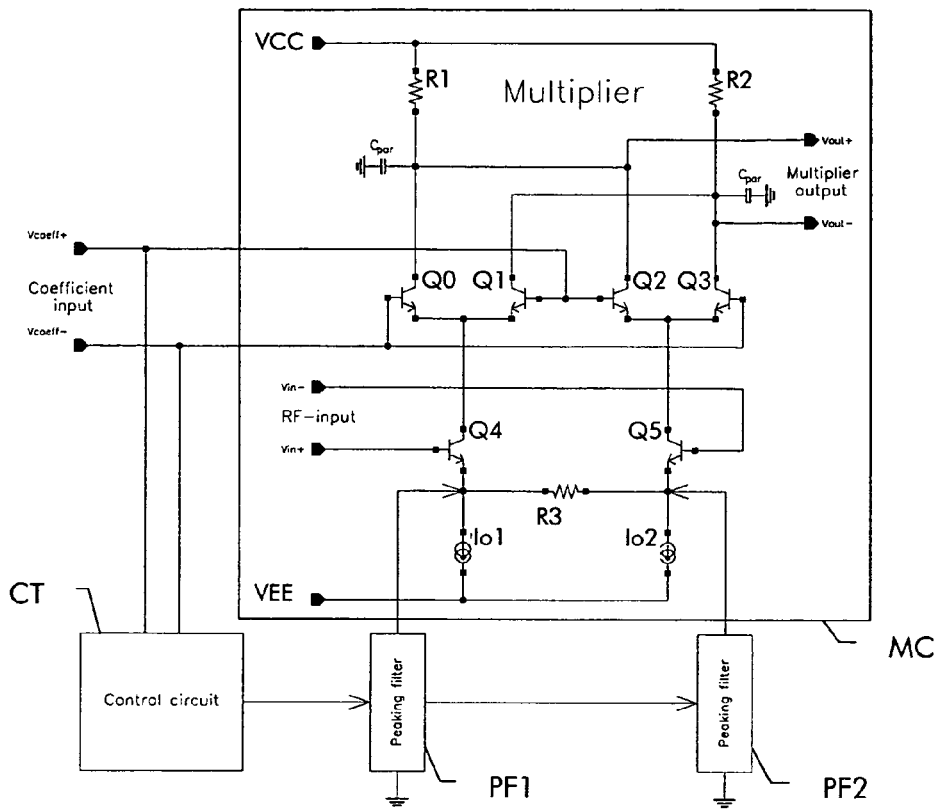
FIG. 3 shows a first embodiment of a multiplier circuit according to the invention.

A first embodiment of the invention is shown in FIG. 3. A first peaking filter PF1 is coupled to the emitter of transistor Q4; a second peaking filter PF2 is coupled to the emitter of transistor Q5. Both peaking filters PF1, PF2 are connected to earth level. The peaking filters have an adjustable frequency response and are controlled by a common control circuit CT, that receives as an input the coefficient signal input Vcoeff+, Vcoeff−.

An implementation for the peaking filter is shown in FIGS. 4a and 4b. In principle, the peaking filter as shown in FIG. 4a is composed of a peaking capacitor $C_p$ and a variable resistance $R_p$. The resistance is controlled by a control signal ctrl from the control circuit CT. In operation, the resistance is higher for high coefficient signal values and lower for low coefficient signal values. For integration with integrated circuit technology, the variable resistance can be implemented for instance by a MOS transistor $M_p$ as shown in FIG. 4b.

Figure 5:
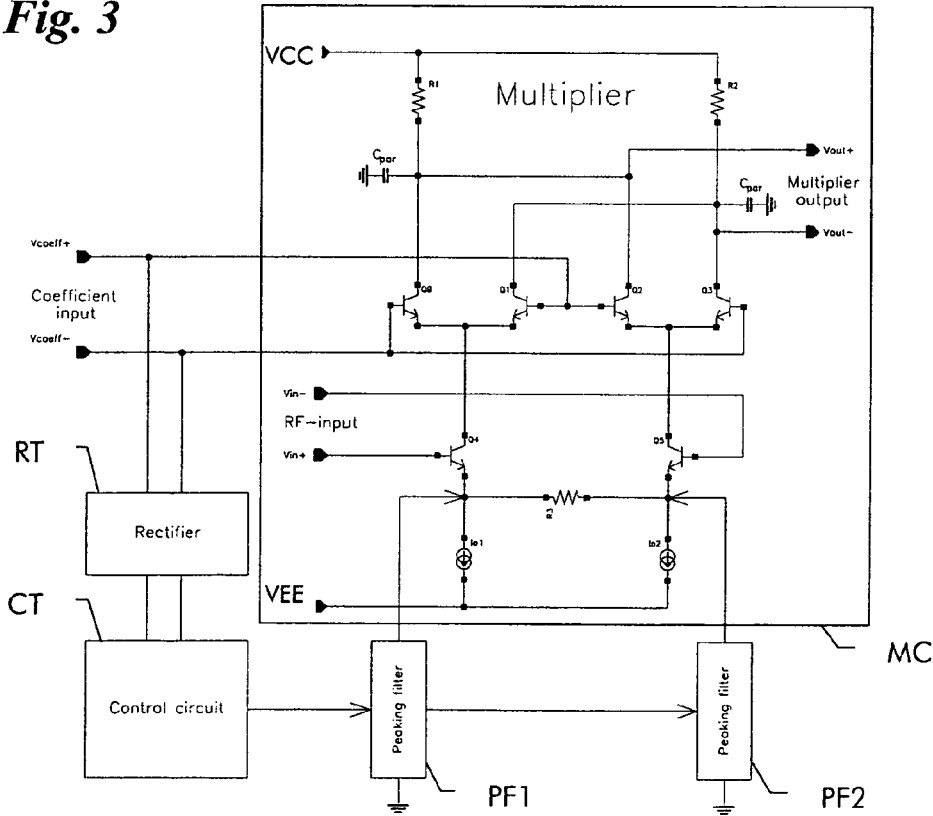
FIG. 5 shows an improvement of the embodiment from FIG. 4.

For applications where a full four-quadrant function of the analogue multiplier is required, i.e. negative and positive differential coefficient signal values, it is advantageous to connect a rectifier circuit RT between the coefficient signal input Vcoeff+, Vcoeff− of the multiplier and the control circuit CT. This is shown in FIG. 5.

Figure 6:
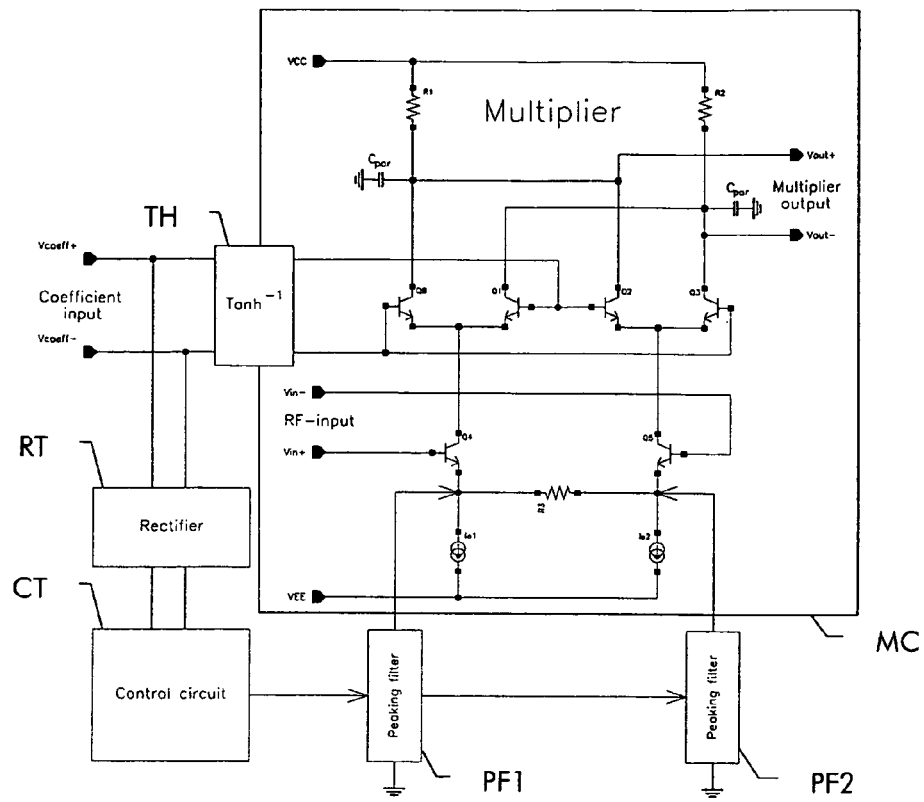
FIG. 6 shows an improvement of the embodiment from FIG. 5.

Moreover, in some applications it proves advantageous to provide a Tanh$^{-1}$ circuit TH at the coefficient signal input of the multiplier to linearise the coefficient signal input, because the coefficient signal input at the multiplier needs a nonlinear behaviour at small voltages. This is shown in FIG. 6. For the control of the control circuit CT it is easier to use the linear and higher voltage signal before the Tanh$^{-1}$ circuit TH.

The function of the controllable peaking filters PF1, PF2 is as follows: At high coefficient voltages the controllable resistance is in a high resistance state. The effect of the in series connected peaking capacitor is hence negligible. The resistance decreases at lower coefficient voltages and the capacitance hence to become active. At lowest coefficient voltages the resistance is at its lowest value and the capacitance has this its full effect.

Figure 7:
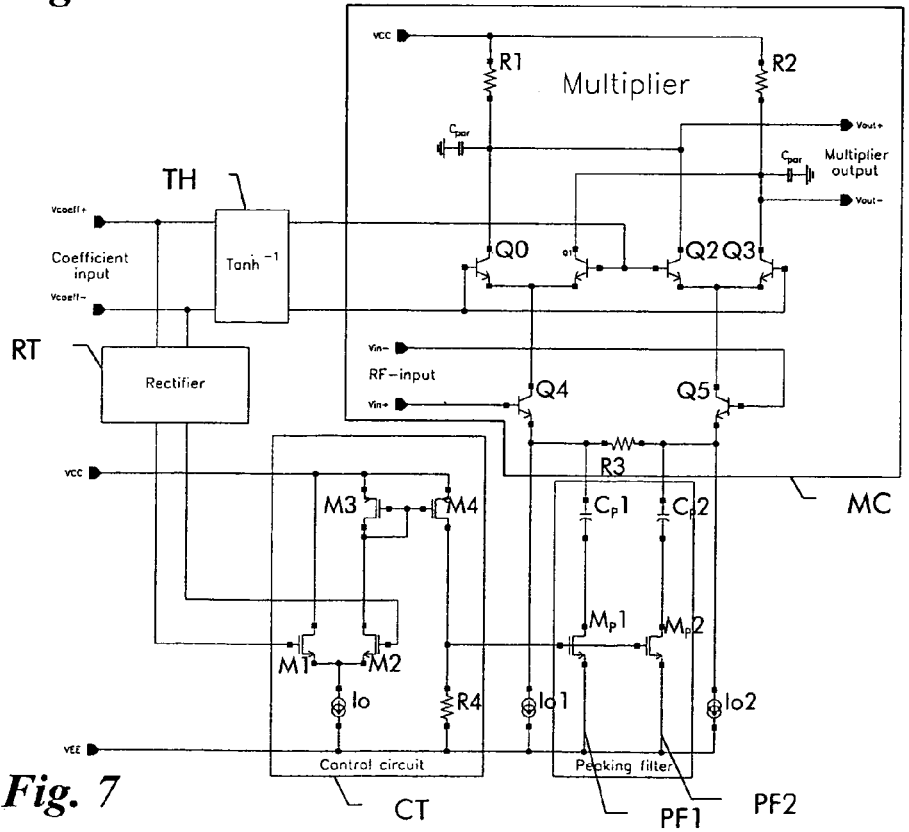
FIG. 7 shows an implementation of the circuit from FIG. 6.

An exemplary control circuit for the peaking filter is shown in FIG. 7. The control circuit consists of a differential amplifier stage of two n-MOS transistors M1 and M2, a current mirror stage of p-MOS-transistors M3 and M4, and a load resistor R4. An increasing coefficient voltage difference Vcoeff+−Vcoeff− at the gates of M1 and M2 leads to a decreasing drain current of M2, which provides the p-MOS current mirror M3 and M4 with this current. The decreased mirrored current at M4 leads to a decreasing voltage drop over the load resistor R4 and therefore to a decreasing voltage at the gates of the MOS-transistors Mp1 and Mp2 of the peaking filter PF1, PF2, which works as controllable resistances. The MOS-transistors Mp1, Mp2 of the peaking filter PF1, PF2 hence go in a higher resistive state because of their lower gate-source voltages. Vice versa, a decreasing coefficient voltage difference leads to a higher gate-source voltage of Mp1 and Mp2 and therefore to a lower resistive state, which increases the effect of the peaking capacitors Cp1 and Cp2.

The relationship between the coefficient voltage difference and the gate-source voltages of Mp1 and Mp2 can be determined by the transmission characteristic of the control circuit, i.e. dimensioning of the gain, the current mirror relation and the load resistance.

The control circuit can alternatively also be implemented using p-FET transistors or bipolar transistors in for example the differential amplifier stage. Moreover, in an integrated circuit design, the control circuit can also be designed to additionally perform other coefficient-dependent control functions potentially required on the some chip.

In the above embodiments, resistors R1 and are chosen to 60 Ohm, resistor R3 has 75 Ohm, resistor R4 has 23 kOhm, peaking capacitors Cp1 and Cp2 have 90 fF and the constant current sources Io1 and Io2 are adjusted to 5 mA and constant current source Io to 200 µA. The selection for these components, however, depends on the semiconductor technology used. In the embodiment, the transistors Q0-Q5 are implemented using fast bipolar semiconductor technology allowing a transit frequency of 200 GHz.

Having described preferred several embodiments of the invention, it should be noted that various modifications and substitutions would be apparent to those skilled in the art without departing from the concepts of the invention. For example, the RF input signals are fed in the figures directly to the respective input leads. However, additional emitter followers (not shown) can be provided at the inputs leads. For instance, the RF input signals can be fed via two respective input followers per input to the respective input leads in the figures.

What is claimed is:

1. An analogue multiplier circuit comprising a multiplier cell with an RF input and a coefficient signal input; at least one variable peaking filter connected to the multiplier cell; and a control circuit connected to the coefficient signal input of the multiplier for controlling the peaking filter in dependence of the input coefficient signal.

2. An analogue multiplier circuit according to claim 1, wherein said variable peaking filter contains at least one peaking capacitor and a variable resistance, wherein one side of the peaking capacitor is connect to the multiplier cell and the other side via the variable resistance, to earth level.

3. An analogue multiplier circuit according to claim 2, wherein said variable resistance is a MOS-transistor.

4. An analogue multiplier circuit according to claim 1, wherein said multiplier cell is a Gilbert cell.

5. An analogue multiplier circuit according to claim 1, wherein said control circuit is adapted to control said variable peaking filter such that the impact of the peaking filter is reduced towards higher coefficient voltage values at the coefficient signal input.

6. An analogue multiplier circuit according to claim 1, wherein said control circuit comprises a differential amplifier stage, a current mirror stage coupled to said differential amplifier stage, and a load resistor coupled to said current mirror stage.

7. An analogue multiplier circuit according to claim 6, wherein said differential amplifier stage comprises two n-MOS transistors and wherein said current mirror stage comprises two p-MOS-transistors.

8. An analogue multiplier circuit according to claim 1, wherein a rectifier is provided between the coefficient input of the multiplier cell and the control circuit for the peaking filter.

* * * * *